United States Patent
Ichihara

[11] Patent Number: 5,212,481
[45] Date of Patent: May 18, 1993

[54] CIRCUIT FOR CODE CONVERTING PCM CODES

[75] Inventor: Masaki Ichihara, Tokyo, Japan
[73] Assignee: NEC Corporation, Tokyo, Japan
[21] Appl. No.: 649,592
[22] Filed: Feb. 1, 1991

[30] Foreign Application Priority Data

Feb. 1, 1990 [JP] Japan .................. 2-24073

[51] Int. Cl.$^5$ .............................. H03M 7/50
[52] U.S. Cl. ............................ 341/75; 375/25
[58] Field of Search ............ 341/75, 4, 108, 138, 341/55, 76, 93; 375/25

[56] References Cited

U.S. PATENT DOCUMENTS 4,189,715 2/1980 Duttweiler .................. 341/75
4,467,318 8/1984 Zeitraeg ..................... 341/75

Primary Examiner—A. D. Pellinen
Assistant Examiner—B. K. Young
Attorney, Agent, or Firm—Laff, Whitesel, Conte & Saret

[57] ABSTRACT

A circuit for converting a 8-bit μLawPCM code into a 14-bit linear code comprising an inversion circuit receiving a 8-bit μLawPCM code for outputting a 8-bit inverted signal. A 6-bit signal is obtained by putting a bit of "1" at a place lower than the least significant bit of less significant four bits of the 8-bit inverted signal by one bit and another bit of "1" at a place higher than the most significant bit of the less significant four bits of the 8-bit inverted signal by one bit. The 6-bit signal is shifted by a bit shift circuit in the most significant bit direction by the amount which is within a range of 0 bit to 7 bits and which is determined by second to fourth significant bits of the 8-bit inverted signal. The result of shift in the form of 13-bit signal outputted from the bit shift circuit is added with a predetermined number by a constant number addition circuit, and a 14-bit linear code is constituted of a 13-bit output of the addition circuit and the most significant bit of the 8-bit inverted signal added as a sign bit.

8 Claims, 4 Drawing Sheets

CIRCUIT FOR CODE CONVERTING PCM CODES

BACKGROUND OF THE INVENTION

1. Field of the Invention

The present invention relates to a code conversion circuit, and more specifically to a code conversion circuit for converting a 8-bit μLawPCM code into a 14-bit linear code.

2. Description of Related Art

In the prior art, correspondence between a 8-bit μLawPCM code (simply called a "μLaw code" hereinafter) and a 14-bit linear code (simply called a "linear code" hereinafter) is defined under the CCITT (Comité Consultatif International Télégraphique et Téléphonique) recommendation G-711.

General purpose 8-bit PCM CORDICs for this μLaw code have been extensively used for interfaces between an analog signal and a digital signal in a digital signal processing, since these are inexpensive and easily available. Since the μLaw code adopts a non-linear encoding system for the purpose of compressing the amount of data, it is not possible to perform a required arithmetic operation (such as addition, subtraction, multiplication and division) for the μLaw code without modification. Therefore, in order to make the digital signal processing possible, a code conversion circuit has been used so as to convert the μLaw code into the linear code.

One typical conventional code conversion circuit has composed of a ROM (read only memory) configured to receive at its address input the μLaw code of 8 bits and to output a stored data corresponding to the received address, as the linear code of 14 bits. Therefore, this conventional code conversion circuit can be easily realized by writing 256 items of data corresponding to the 8 bits, into a commercially available PROM (programmable ROM) or a commercially available masked ROM. Accordingly, in designing a device composed of discrete components, the code conversion circuit has constituted one very simple and inexpensive discrete component.

However, with recent advancement of semiconductor technology, the field of the digital signal processing shows a tendency in which the whole of the device which has been composed of discrete components is assembled in the form of a LSI (large scale integrated circuit). Because of this tendency, it has been required to design this type of code conversion circuit as a part of a large circuit assembled in an LSI chip, not as a single function component.

However, if the code conversion circuit is formed in an LSI chip using a ROM similar to the prior art, a memory capacity of 128 words × 14 bits is required even if the data is compressed by utilizing the sign of codes. This results in an increased chip size and in an increased cost of the chip.

SUMMARY OF THE INVENTION

Accordingly, it is an object of the present invention to provide a code conversion circuit for converting the μLaw code into the linear code, which includes no ROM and which can be realized with a small chip size and a decreased cost.

The above and other objects of the present invention are achieved in accordance with the present invention by a code conversion circuit for converting the μLaw code into the linear code, comprising an inversion circuit receiving a 8-bit signal for outputting a 8-bit inverted signal, a bit shift circuit having a data input connected to receive four less significant bits of the 8-bit inverted signal and a control input connected to receive three bits selected from four more significant bits of the 8-bit inverted signal, the bit shift circuit operating to shift the data input in a direction toward the most significant bit by a range of 0 bit to seven bits determined by the control input, and a constant number addition circuit receiving an output of the bit shift circuit for adding a predetermined constant number to the output of the bit shift circuit, the most significant bit of the 8-bit inverted signal being a sign bit and being combined with an output of the addition circuit so as to form the linear code.

In one embodiment, the bit shift circuit includes a one-bit shifter, a two-bit shifter and a four-bit shifter which are connected in a cascaded manner and controlled by the fourth, third and second significant bits of the 8-bit inverted signal, respectively. The constant number addition circuit includes a first full adder for adding an inverted bit of the sign bit to the least significant bits of the 8-bit inverted signal, and second to eighth full adders for adding "1" or "0" to the second less significant bit to the most significant bit of the 8-bit inverted signal, respectively.

As mentioned hereinbefore, the CCITT recommendation G-711 defines the correspondence between the μLaw code and the linear code. Analyzing this recommendation, a rule of conversion between the μLaw code and the linear code can be described as follows:

First, represent the μLaw code by $X = \{x_1, x_2, x_3, x_4, x_5, x_6, x_7, x_8\}$, where $x_i$ indicates a value of each bit, and $x_1$ is MSB (most significant bit) and $x_8$ is LSB (least significant bit). Also, represent the linear code by $Y = \{y_1, y_2, y_3, y_4, y_5, y_6, y_7, y_8, y_9, y_{10}, y_{11}, y_{12}, y_{13}, y_{14}\}$, where $y_i$ indicates a value of each bit, and $y_1$ is MSB (most significant bit) and $y_{14}$ is LSB (least significant bit), similarly to the μLaw code. In addition, represent the inversion of the μLaw code by $\overline{X} = \{\overline{x}_1, \overline{x}_2, \overline{x}_3, \overline{x}_4, \overline{x}_5, \overline{x}_6, \overline{x}_7, \overline{x}_8\}$.

As a result, the relation between Y and $\overline{X}$ can be expressed as follows:

$$y_1 = \overline{x}_1 \tag{1}$$

$$\sum_{i=2}^{14} y_i \cdot 2^{14-i} = 2^{(4 \cdot \overline{x}_2 + 2 \cdot \overline{x}_3 + \overline{x}_4)} \cdot \left( 33 + \sum_{i=5}^{8} \overline{x}_i \cdot 2^{9-i} \right) - 33 \tag{2}$$

The above equation (1) indicates that the most significant bit $y_1$ of the linear code Y is equal to the most significant bit $x_1$ of the inverted code $\overline{X}$ of the μLaw code. On the other hand, the equation (2) shows the less significant 13 bits of the linear code Y, which can be obtained in the following calculation procedures ①, ② and ③.

In the procedure ①, the less significant four bits of the inverted code $\overline{X}$ is shifted by one bit in a more significant bit direction, and then, added with a binary number corresponding to "33" in a decimal notation. In the succeeding procedure ②, the thus obtained result is shifted in the more significant bit direction by the number of digits expressed by the binary number ($\overline{x}_2, \overline{x}_3, \overline{x}_4$). In the final procedure ③, a binary number corresponding to "33" in a decimal notation is subtracted from the result of the second procedure ②.

The present invention is to realize the above mentioned algorithm of the equations (1) and (2) by means of a pure combinational logic circuit.

The above and other objects, features and advantages of the present invention will be apparent from the following description of preferred embodiments of the invention with reference to the accompanying drawings.

DESCRIPTION OF THE PREFERRED EMBODIMENTS

Figure 1:
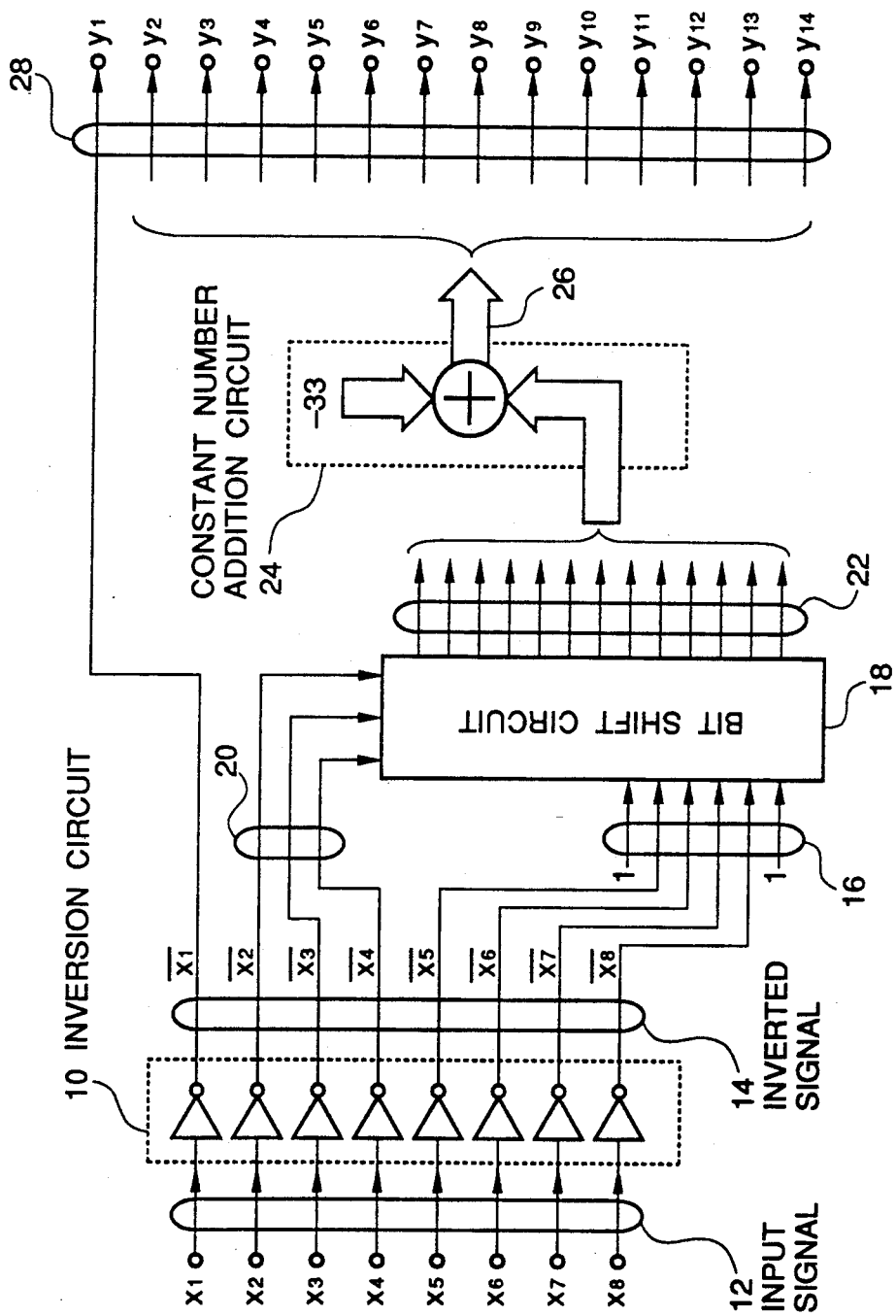
FIG. 1 is a block diagram of a first embodiment of the code conversion circuit in accordance with the present invention.

Referring to FIG. 1, there is shown a block diagram of a first embodiment of the code conversion circuit in accordance with the present invention.

As shown in FIG. 1, the code conversion circuit includes an inversion circuit 10 receiving an input signal X, 12 ($x_1$ to $x_8$) of 8 bits in the form of a $\mu$LawPCM code and outputs an inverted $\mu$LawPCM code $\overline{X}$, 14 ($\overline{x}_1$ to $\overline{x}_8$). For example, the inversion circuit 10 is constituted of 8 NOT circuits arranged in parallel to each other. Less significant four bits ($\overline{x}_5$, $\overline{x}_6$, $\overline{x}_7$, $\overline{x}_8$) of the thus obtained inverted $\mu$LawPCM code $\overline{X}$ are extracted from the output of the inversion circuit 10, and a signal 16 of six bits is obtained by adding a bit of "1" at a place lower than the least significant bit $\overline{x}_8$ of the extracted less significant four bits ($\overline{x}_5$, $\overline{x}_6$, $\overline{x}_7$, $\overline{x}_8$) by one bit and also adding another bit of "1" at a place higher than the most significant bit $\overline{x}_5$ of the extracted less significant four bits ($\overline{x}_5$, $\overline{x}_6$, $\overline{x}_7$, $\overline{x}_8$) by one bit. The 6-bit signal 16 thus obtained is inputted to a data input of a bit shift circuit 18, which in turn has a control input connected to receive a control signal 20 formed of second to fourth significant bits ($\overline{x}_2$, $\overline{x}_3$, $\overline{x}_4$) of the inverted $\mu$LawPCM code $\overline{X}$, 14. The bit shift circuit 18 operates to shift the 6-bit signal 16 in a most significant bit direction by the amount of 0 bit to 7 bits which is determined by the value of the control signal 20 represented by the second to fourth significant bits ($\overline{x}_2$, $\overline{x}_3$, $\overline{x}_4$). The result of the shift is outputted from the bit shift circuit 18 in the form of a 13-bit signal 22, which is in turn supplied to one input of a constant number addition circuit 24. This addition circuit 24 has a second input receiving a predetermined constant number, namely "−33" in this embodiment, and outputs the result of addition in the form of a 13-bit signal 26. A linear code 28, Y of 14 bits is constituted of the output 26 of the addition circuit 24 and the most significant bits $\overline{x}_1$ of the inverted $\mu$LawPCM code $\overline{X}$, 14 added to a place higher than the most significant bit of the output 26 of the addition circuit 24 by one bit. Namely, the linear code Y (=$y_1$ to $y_{14}$) is composed of a sign bit and data bits indicative of an absolute value.

In the above mentioned code conversion circuit, if a $\mu$Law signal 12 is given, it is inverted by the inversion circuit 10, and the most significant bit $\overline{x}_1$ of the inverted input code $\overline{X}$ is outputted as the most significant bit $y_1$ of the linear code Y. The four less significant bits $\overline{x}_5$, $\overline{x}_6$, $\overline{x}_7$, $\overline{x}_8$ of the inverted input code $\overline{X}$ are shifted in the more significant bit direction by one bit and also added with "33" so as to form the 6-bit signal 16. This 6-bit signal 16 is supplied to the bit shift circuit 18, and shifted in the more significant bit direction by the number of bits determined by the control signal 20 formed of $\overline{x}_2$, $\overline{x}_3$, $\overline{x}_4$, as shown in the following table:

TABLE 1

| $\overline{x}_2$ | $\overline{x}_3$ | $\overline{x}_4$ | amount of shift |
|---|---|---|---|
| 0 | 0 | 0 | 0 |
| 0 | 0 | 1 | 1 |
| 0 | 1 | 0 | 2 |
| 0 | 1 | 1 | 3 |
| 1 | 0 | 0 | 4 |
| 1 | 0 | 1 | 5 |
| 1 | 1 | 0 | 6 |
| 1 | 1 | 1 | 7 |

The result of the shift is outputted in the form of the 13-bit signal 22, and added with "−33" in the constant number addition circuit 24. The result of addition is outputted as the 13 less significant bits of the linear code 28, Y.

The linear code obtained in the above mentioned embodiment is of the "sign bit+absolute value" type.

Figure 2:
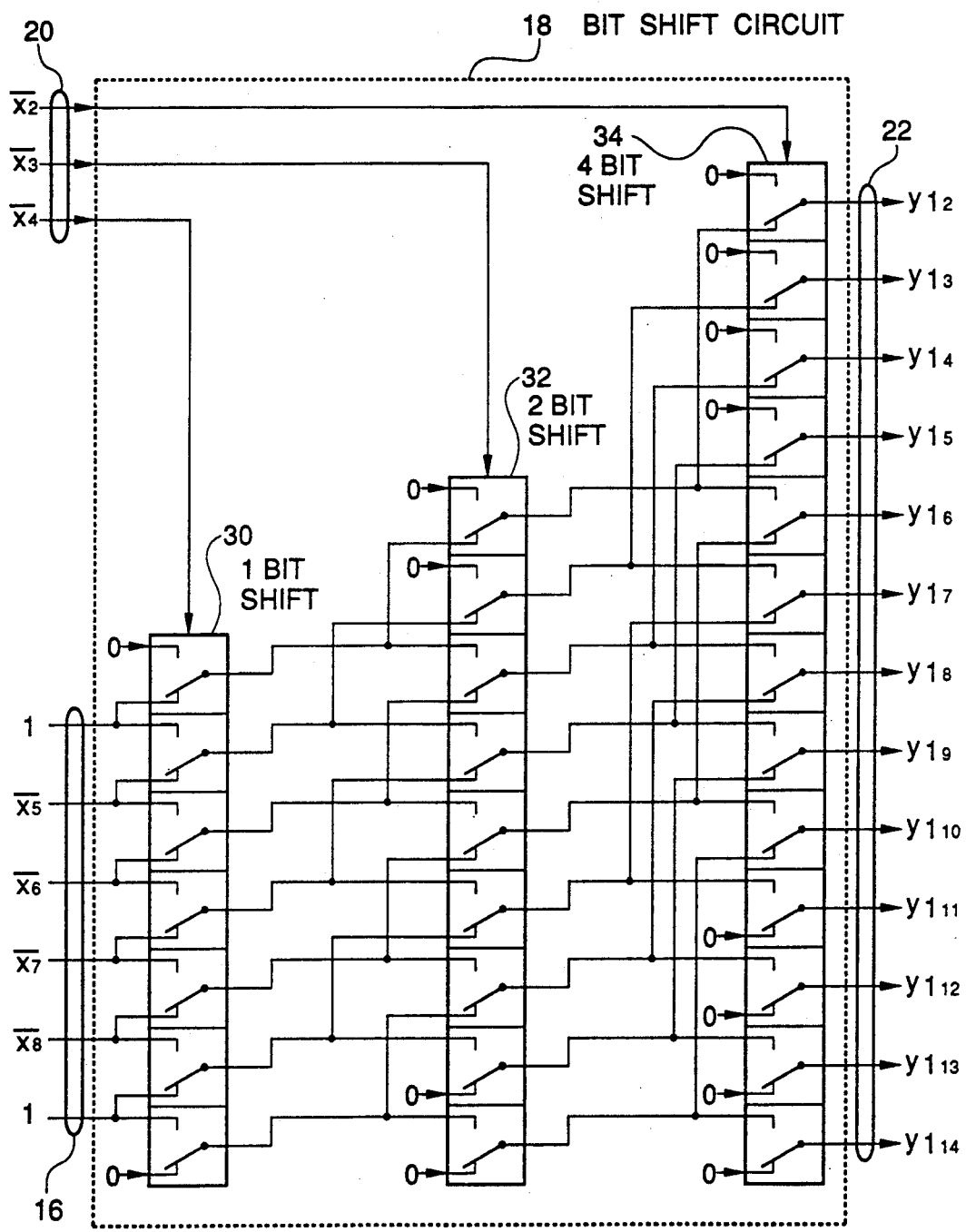
FIG. 2 is a circuit diagram of the bit shift circuit incorporated in the code conversion circuit shown in FIG. 1.

Referring to FIG. 2, there is shown the circuit diagram of the bit shift circuit 18 shown in FIG. 1.

As seen from FIG. 2, the bit shift circuit 16 is composed of a one-bit shifter 30, a two-bit shifter 32 and a four-bit shifter 34 which are coupled in a cascaded manner, and which are respectively controlled by the inverted bits $\overline{x}_4$, $\overline{x}_3$ and $\overline{x}_2$ outputted from the inversion circuit 10. Each of the shifters 30, 32 and 34 performs its shift operation when the received inverted bit is of "1", and operates as a simple path when the received inverted bit is of "0". Each of the shifters 30, 32 and 34 is shown in the form of a switch array, but it would be apparent to persons skilled in the art that each switch of the switch array can be formed of a transfer gate or an AND-OR gate.

Figure 3:
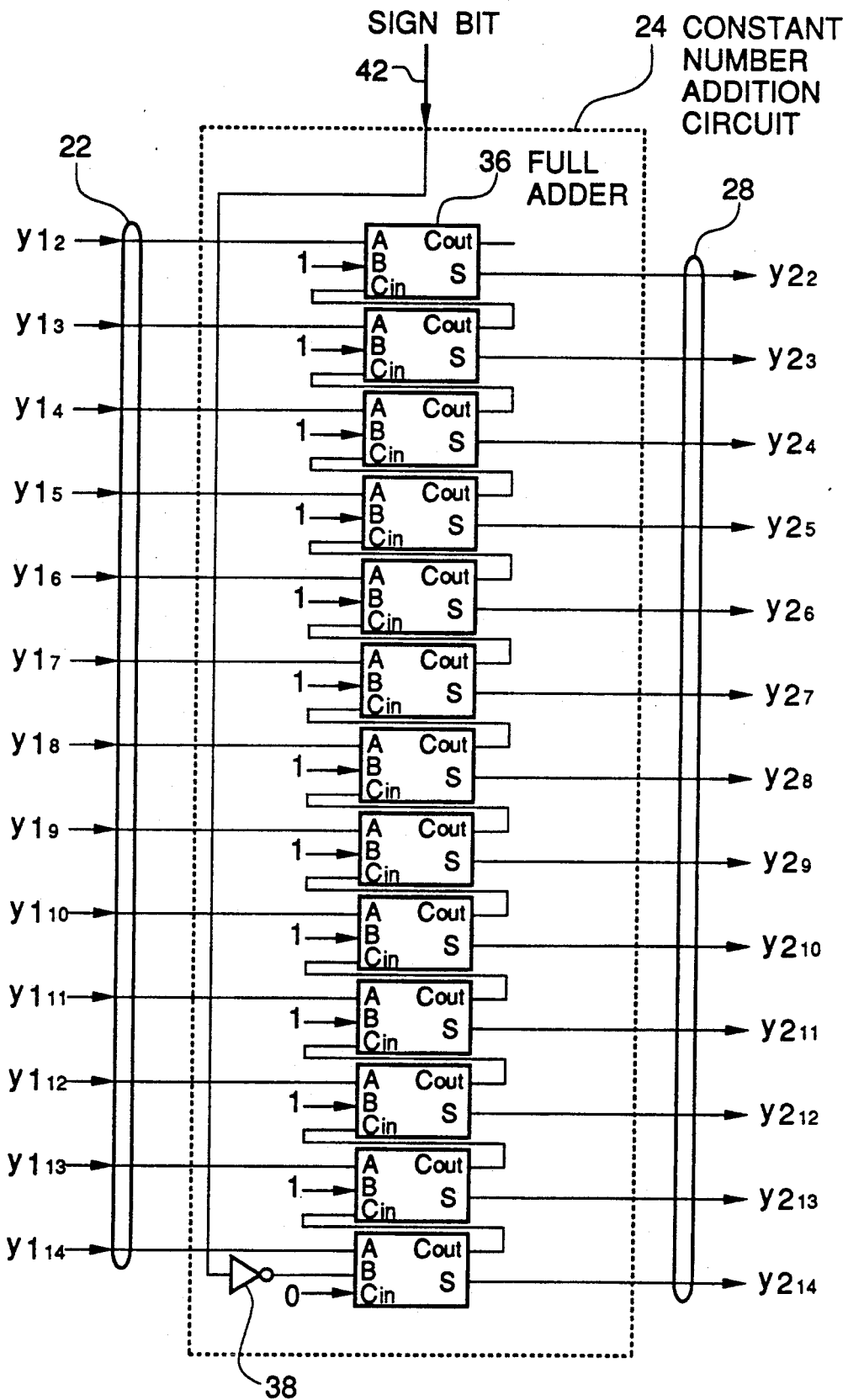
FIG. 3 is a circuit diagram of the constant number addition circuit incorporated in the code conversion circuit shown in FIG. 1.

Turning to FIG. 3, there is shown a circuit diagram of the constant number addition circuit 24 shown in FIG. 1.

As shown in FIG. 3, the constant number addition circuit 24 includes 13 full adders 36 arranged in parallel in such a manner that a carry output Cout of each full adder is connected to a carry input Cin of a next significant bit full adder, and each of the full adder has a first input A connected to receive a corresponding bit of the output signal 22 of the bit shift circuit 18 and a second input B connected to receive a constant bit of "1". With this arrangement, the output signal 22 of the bit shift circuit 18 is added with a two's compliment of "33" or "34". A switchover between "−33" and "−34" is determined by bringing the least significant bit of the addend constant number "1" or "0". For this purpose, the least significant bit of the addend constant number is given by an output signal of an inverter 38 receiving the sign bit 42, $x_1$. However, since "−33" is added in the first embodiment, this changeover is not necessary, and therefore, the second input of the least significant bit fuller adder is connected to a "0" level without receiving the sing bit $x_1$, although this connection is not shown.

As well known, the logical operation of each full adder can be expressed as follows:

$$S = A \oplus B \oplus Cin.$$

$$Cout = A \cdot B + (A+B) \cdot Cin \quad (3)$$

where $\oplus$ indicates the exclusive−OR, "·" shows AND, and "+" means OR.

Figure 4:
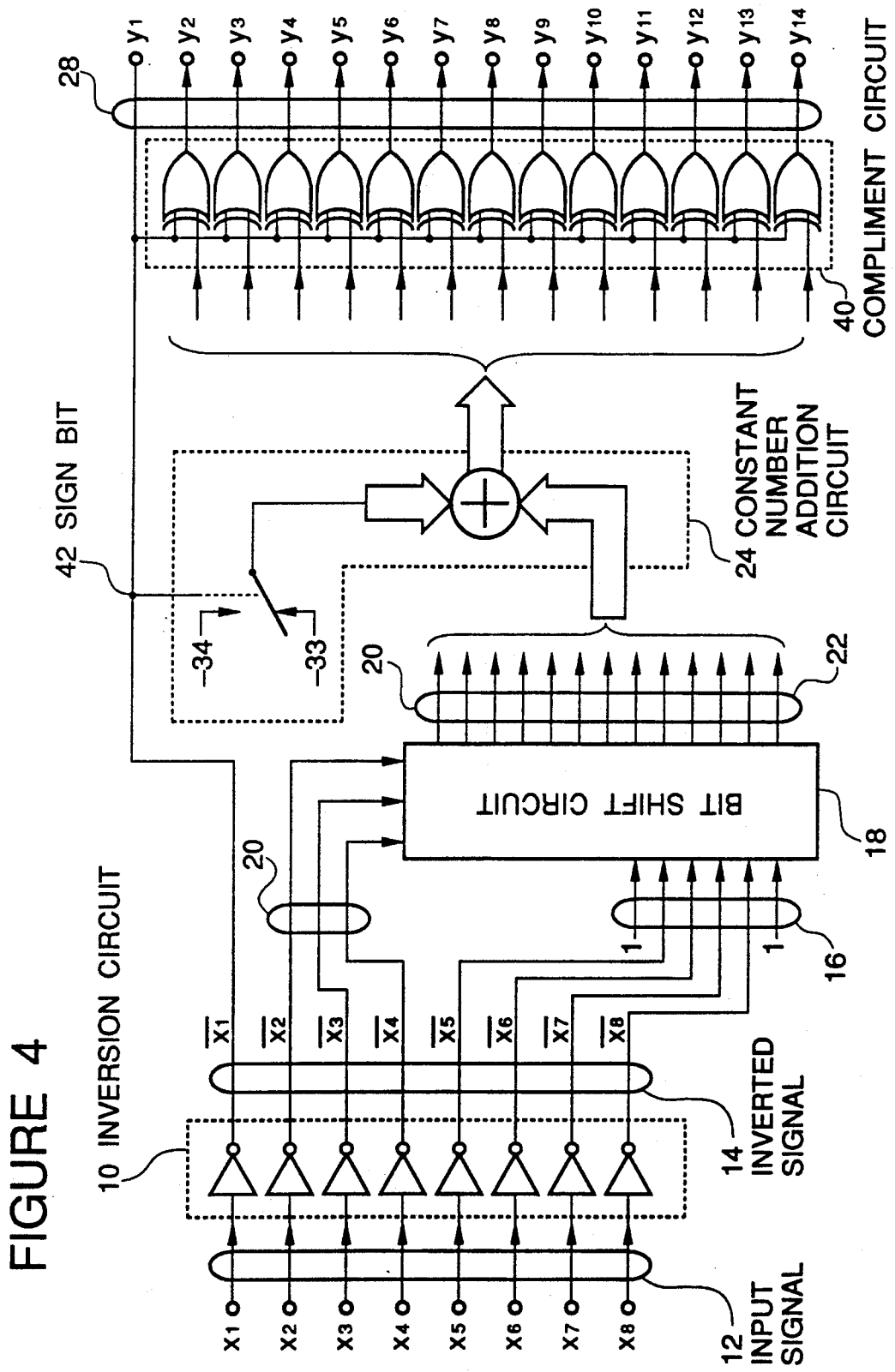
FIG. 4 is a block diagram of a second embodiment of the code conversion circuit in accordance with the present invention.

Referring to FIG. 4, there is shown a second embodiment of the code conversion circuit. In FIG. 4, elements similar to those shown in FIG. 1 are given the same Reference Numerals, and explanation thereof will be omitted.

As seen from comparison between FIGS. 1 and 4, the second embodiment includes a one's compliment circuit 40 which outputs an exclusive−OR between the output of the constant number addition circuit 24 and the most significant bit $\bar{x}_1$, namely the sign bit of the inverted code $\bar{X}$. For example, the one's compliment circuit 40 includes 13 exclusive−OR gates each of which has a first input connected to a corresponding bit of the output of the constant number addition circuit 24 and a second input connected to the sign bit $\bar{x}_1$ of the inverted code $\bar{X}$. A 13-bit output ($y_2$ to $y_{14}$) of one's compliment circuit 40 is combined with the most significant bit $\bar{x}_1$, namely the sign bit 42 of the inverted code $\bar{X}$, so that a 14-bit linear code 28 can be obtained.

In order to add "1" to the inverted data, another addition circuit is required. But, for suppressing the increase of the circuit size, an equivalent means is realized by preparing two constant numbers, "−33" and "−34" to be added in the constant number addition circuit 24, so that when the sign bit 42, $\bar{x}_1$ is "0", "−33" is added and when the sign bit 42, $\bar{x}_1$ is "1", "−34" is added.

As seen from the above, the code conversion circuit in accordance with the present invention is constituted of the inversion circuit, the bit shift circuit and the addition circuit, without using a ROM which has been required in the conventional one, so that the μLaw code can be converted into the linear code by means of only a pure combinational logic circuit. Therefore, the circuit size of the code conversion circuit can be compressed when it is assembled in a single chip, so that the overall chip size can be correspondingly reduced and the cost of the chip can be decreased.

The invention has thus been shown and described with reference to the specific embodiments. However, it should be noted that the present invention is in no way limited to the details of the illustrated structures but changes and modifications may be made within the scope of the appended claims.

We claim:

1. A code conversion circuit comprising an inversion circuit means for receiving an 8-bit code signal and for outputting an 8-bit inverted code signal, a bit shift circuit means having a data input and a control input, means for connecting said data input to receive four less significant bits of the 8-bit inverted code signal, means for connecting said control input to receive three bits selected from four more significant bits of the 8-bit inverted code signal, means for operating the bit shift circuit means to shift the input data in a direction toward the most significant bit by a range from 0 bit to seven bits in response to a signal at said control input, and means for adding a predetermined constant number to an output of the bit shift circuit means, the most significant bit of the 8-bit inverted code signal being a sign bit and being combined with an output of the addition circuit so as to form a linear code.

2. A code conversion circuit for converting a μLawPCM code of 8-bits into a linear code, said conversion circuit comprising an inversion circuit coupled to receive an 8-bit signal of said μLawPCM code and to output an 8-bit inverted code signal responsive thereto, means for giving a 6-bit signal which is obtained by adding a "1" bit to a less significant four bits of said 8-bit inverted code signal at a place which is lower than the least significant bit of said less significant four bits of said 8-bit inverted code signal by one bit and by adding another "1" bit at a place higher than the most significant bit of the less significant four bits of said 8-bit inverted code signal by one bit, a bit shift circuit means having a data input coupled to receive and shift the 6-bit signal in the most significant bit direction by an amount which is within a range from a 0 bit to 7 bits and which is determined by second to fourth significant bits of said 8-bit inverted code signal, said bit shift circuit means outputting the result of a shift in the form of a 13-bit signal, and a constant number addition circuit means coupled to receive said 13-bit signal for adding a predetermined number to said 13-bit signal, so that a 14-bit linear code is constituted of a 13-bit output of said addition circuit and the most significant bit of said 8-bit inverted code signal is added as a sign bit at a place higher than the most significant bit of the 13-bit output of said addition circuit by one bit.

3. A code conversion circuit claimed in claim 2 wherein said bit shift circuit means includes a one-bit shifter means, a two-bit shifter means, and a four-bit shifter means which are connected in cascade and controlled in response to the fourth, third and second significant bits of said 8-bit inverted code signal, respectively.

4. A code conversion circuit claimed in claim 2 wherein said constant number addition circuit means includes a first full adder means for adding an inverted bit of said sign bit to the least significant bits of said 8-bit inverted signal, and second to eighth full adder means for adding "1" or "0" to the second less significant bit to the most significant bit of said 8-bit inverted signal, respectively.

5. A code conversion circuit for converting μLawPCM code of 8 bits into a linear code, said conversion circuit comprising an inversion circuit for receiving an 8-bit signal of μLawPCM code and for outputting an 8-bit inverted 8-bit inverted code signal, a bit shift circuit means having a data input connected to receive a 6-bit signal, means for obtaining said 6-bit signal by adding a "1" bit to less significant four bits of said 8-bit inverted code signal at a place which is lower than the least significant bit of said less significant four bits of said 8-bit inverted code signal by one bit and another "1" bit at a place which is higher than the most significant bit of the less significant four bits of said 8-bit inverted code signal by one bit, said bit shift circuit means operating to shift the received 6-bit signal in the most significant bit direction by an amount which is within a range of 0 to 7 bits and which is determined by second to fourth significant bits of said 8-bit inverted code signal, said bit shift circuit means outputting the result of a shift in the form of a 13-bit signal, and a constant number addition circuit means coupled to receive said 13-bit signal for adding a predetermined number to said 13-bit signal, and a one's complement circuit means for receiving a 13-bit output of said addition circuit and for outputting an exclusive-OR between said 13-bit output of said addition circuit and the most significant bit of said 8-bit inverted code signal, so that a 14-bit linear code is constituted of a 13-bit output of one's complement circuit and the most significant bit of said 8-bit inverted code signal added as a sign bit place higher than the most significant bit of the 13-bit output of said one's complement circuit by one bit.

6. A code conversion circuit claimed in claim 5 wherein said bit shift circuit means includes a one-bit shifter means, a two-bit shifter means, and a four-bit shifter means which are connected in cascade and controlled by the fourth, third and second bits of said 8-bit inverted code signal, respectively.

7. A code conversion circuit claimed in claim 5 wherein said constant number addition circuit means includes a first full adder means for adding an inverted bit of said sign bit to the least significant bits of said 8-bit inverted signal, and second to eighth full adder means for adding "1" or "0" to the second less significant bit to the most significant bit of said 8-bit inverted signal, respectively.

8. A code conversion circuit claimed in claim 5 wherein said one's complement circuit means includes 13 exclusive-OR gates each of which has a first input connected to a corresponding bit of said 13-bit signal outputted from said constant number addition circuit and a second input connected to the most significant bit of said 8-bit inverted signal.

* * * * *